United States Patent [19]

Huang

[11] Patent Number: 5,386,134

[45] Date of Patent: Jan. 31, 1995

[54] ASYMMETRIC ELECTRO-STATIC DISCHARGE TRANSISTORS FOR INCREASED ELECTRO-STATIC DISCHARGE HARDNESS

[75] Inventor: Tiao-Yuan Huang, Cupertino, Calif.

[73] Assignee: VLSI Technology, Inc., San Jose, Calif.

[21] Appl. No.: 156,156

[22] Filed: Nov. 23, 1993

[51] Int. Cl.⁶ .................. H01L 29/06; H01L 29/78
[52] U.S. Cl. .................. 257/360; 257/355; 257/356; 257/344; 257/346; 257/408
[58] Field of Search ............ 257/344, 346, 355–357, 257/360–363, 408

[56] References Cited

U.S. PATENT DOCUMENTS 5,173,755  12/1992  Co et al. .................. 257/360
5,276,346  1/1994   Iwai et al. ................ 257/408

FOREIGN PATENT DOCUMENTS 4-18762  1/1992  Japan .................. 257/408
5-55251  3/1993  Japan .................. 257/360

OTHER PUBLICATIONS

Y. Wei, Y. Loh, C. Wang and C. Hu, *MOSFET Drain Engineering for ESD Performance*, EOS/ESD Symposium, 1992, pp. 143–148.

*Silicon Processing for the VLSI Era—vol. 2. Process Integration*, pp. 144–152, 154, 155.

C. Duvvury, R. N. Rountree, Y. Fong, and R. A. McPhee, *ESD Phenomena and Protection Issues in CMOS Output Buffers*, IEEE/IRPS, 1987, pp. 174–180.

D. Krakauer, K. Mistry, *ESD Protection in a 3.3 Volt Sub-Micron Silicided CMOS Technology*, EOS/ESD Symposium, 1992, pp. 250–257.

T. Yamaguchi, et al., *High-Speed Latchup-Free 0.5 μm-Channel CMOS Using Self-Aligned TiSi₂ and Deep-Trench Isolation Technologies*, IEDM 83, 24.3, 1983 pp. 522–525.

*Primary Examiner*—J. Carroll
*Attorney, Agent, or Firm*—Douglas L. Weller

[57] ABSTRACT

An asymmetric electro-static discharge transistor includes a gate region formed on a substrate. The gate region includes a polysilicon gate region placed over a dielectric layer. A drain region is placed within the substrate. The drain region includes a first drain region implanted with atoms of a first conductivity type at a first concentration. The first drain region extends under the gate region. For example, the first drain region is a lightly doped n− region. A second drain region is formed adjacent to the first doped portion. The second drain region is implanted with atoms of the first conductivity type. For example, the second drain region is a heavily doped n+ region. A source region is formed within the substrate. The source region extends under the gate region. The source region is implanted with atoms of the first conductivity type. For example, the source region is a heavily doped n+ region.

15 Claims, 5 Drawing Sheets

5,386,134

ASYMMETRIC ELECTRO-STATIC DISCHARGE TRANSISTORS FOR INCREASED ELECTRO-STATIC DISCHARGE HARDNESS

BACKGROUND

This invention relates generally to electro-static discharge transistors connected to circuit input/output pads and used to protect semiconductor devices from damage resulting from electrostatic discharge.

Electrostatic discharge (ESD) can be a source of destruction for semiconductor devices. Various input protection circuits may be used to protect the input circuits from electrostatic discharge damage. However, these same protection circuits are generally not used for output buffers and input/output (I/O) pads due to performance constraints. See for Example, Y. Wei, Y. Loh, C. Wang and C. Hu, *MOSFET Drain Engineering for ESD Performance, EOS/ESD Symposium,* 1992, pp. 143–148. For output buffers and I/O buffers, n-channel pull-down transistors must be properly designed to ensure adequate ESD performance. These n-channel pull-down transistors used for I/O buffers, n-channel pull-down transistors are sometimes referred to as ESD transistors.

As technology scales, various processing changes are made which can effect the ability of ESD transistors to function optimally. For example, in CMOS technology, as circuitry has decreased in size, placing a metal-silicide region immediately over the source-drain region of transistors has been used to minimize the series source-drain resistance. See for example, *Silicon processing for the VLSI Era ——Volume 2, Process Integration,* pp. 144–152. However, placing metal-silicide regions above source-drain regions of ESD transistors can seriously degrade ESD hardness, increasing the possibility of ESD damage to circuitry within semiconductor devices. See for example, C. Duvvury, R. N. Rountree, Y. Fong, and R. A. McPhee, *ESD Phenomena and Protection Issues in CMOS Output Buffers,* IEEE/IRPS, 1987, pp. 174–180.

SUMMARY OF THE INVENTION

In accordance with the preferred embodiment of the present invention, an asymmetric electro-static discharge transistor is presented. A gate region is formed on a substrate. The gate region includes a polysilicon gate region placed over a dielectric layer. A drain region is placed within the substrate. The drain region includes a first drain region implanted with atoms of a first conductivity type at a first concentration. The first drain region extends under the gate region. For example, the first drain region is a lightly doped n− region. A second drain region is formed adjacent to the first doped portion. The second drain region is implanted with atoms of the first conductivity type. For example, the second drain region is a heavily doped n+ region. A source region is formed within the substrate. The source region extends under the gate region. The source region is implanted with atoms of the first conductivity type. For example, the source region is a heavily doped n+ region.

In the preferred embodiment, a metal-silicide region is placed over the source region. There is no metal-silicide region placed over the drain region. Also, an electro-static discharge implant region is placed in the substrate below the drain region. The electro-static discharge implant region is implanted with atoms of the first conductivity type. For example, the electro-static discharge implant region is a lightly doped n− region.

DESCRIPTION OF THE PREFERRED EMBODIMENT

Figure 1:
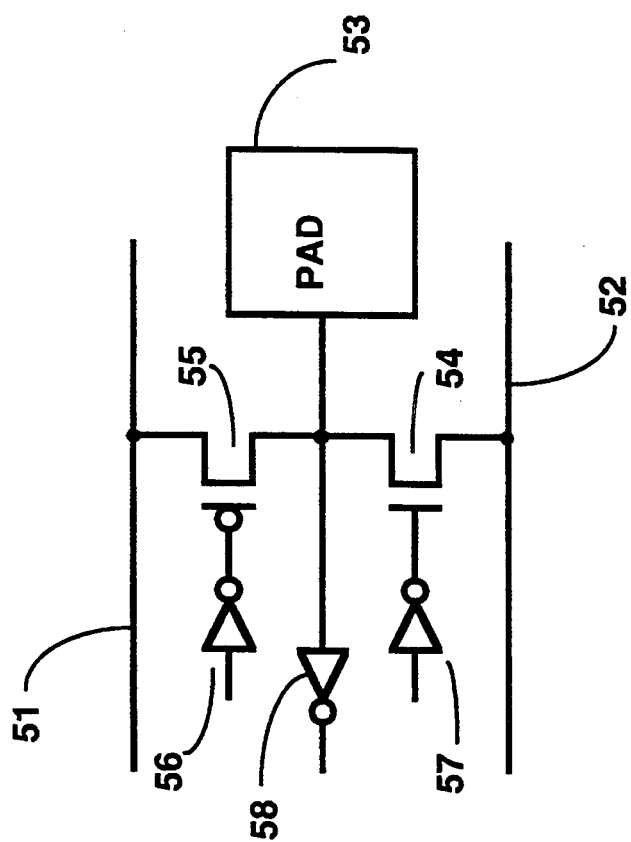
FIG. 1 shows an I/O buffer circuit for an integrated circuit.

FIG. 1 shows an example of a buffer circuit for a pad 53. Many other types of buffer circuits exist to which the teachings of the present invention could be applied. The buffer circuit shown in FIG. 1 selects to be electrically connected to pad 53 either a $V_{DD}$ voltage on a $V_{DD}$ line 51, or a $V_{SS}$ voltage on a $V_{SS}$ line 52. The buffer circuit includes a p-channel buffer transistor 55 and an n-channel buffer transistor 54. P-channel buffer transistor 55 is controlled by an inverter 56. N-channel buffer transistor 54 is controlled by an inverter 57. Input from pad 53 is received by an inverter 58. In the preferred embodiment of the present invention, n-channel buffer transistor 54 is an asymmetric electro-static discharge buffer transistor.

For the preferred embodiment, the requirements for a source junction and a drain junction of an output buffer transistor are quite different. For the drain junction, some kind of drain engineering to achieve a gradient drain junction is normally required. For example a lightly doped drain (LDD) or a double diffused drain (DDD) can be used. This will meet the required hot-carrier lifetime while simultaneously maintaining a sufficient electro-static discharge (ESD) threshold, and a large enough snap-back voltage to allow high-voltage burn-in (B/I). Furthermore in the preferred embodiment, placing a metal-silicide region over the drain junction of an output buffer transistor is undesirable, as such a metal-silicide drain severely degrades the ESD performance by reducing ESD hardness.

However, in the preferred embodiment of the present invention, for the source junction of an output buffer transistor, the most important criteria is to achieve minimum source series resistance. Therefore, a heavily-doped source junction (i.e., instead of LDD), and a metal-silicide source junction are desirable for optimal transistor performance. A heavily-doped source junction reduces the undesirable source series resistance. Source series resistance is more detrimental than drain series resistance in degrading the transistor performance. This is because source series resistance not only adds a series resistance to the source-drain current path, it also degrades the effective gate bias.

A minimum resistance between the different source junctions of NMOS ladder-type pull-down transistors (or multiple looped pull-down transistors) used in CMOS VLSI circuitry is also important in order to ensure that all poly fingers are properly turned on during ESD events, thus promoting good ESD performance.

In the preferred embodiment of the present invention, asymmetric source-drain junctions are used for ESD buffer transistors. Key features of ESD transistors constructed in accordance with the preferred embodiment are the incorporation of a drain junction without silicidation with the use of a source region consisting of a conventional n+ junction with silicidation. Local interconnect (such as TiN formed during TiSi$_2$ salicidation) is also proposed to reduce the series resistance between the source junctions of different transistors in the ladder-type or multiple looped pull-down transistors whenever a short metal routing is not available.

Figure 2:
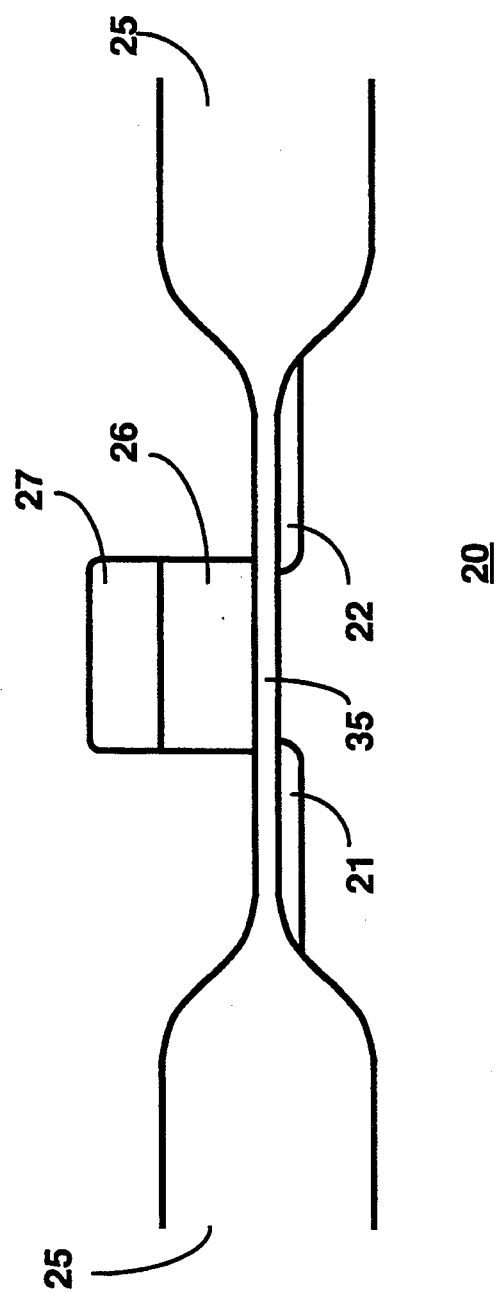
FIGS. 2, 3 and 4 illustrate processing steps for producing an asymmetric electro-static discharge transistor in accordance with a preferred embodiment of the present invention.
Figure 3:
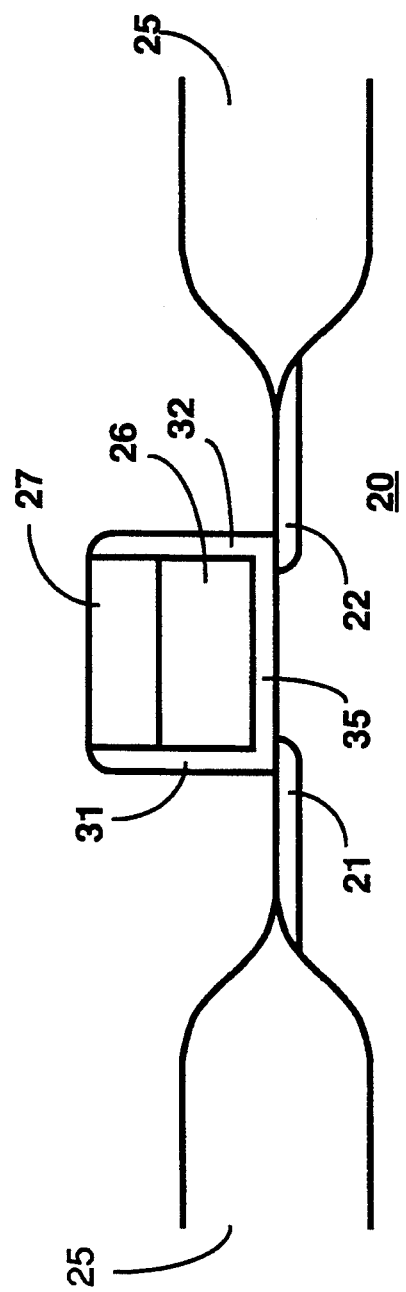
Figure 4:
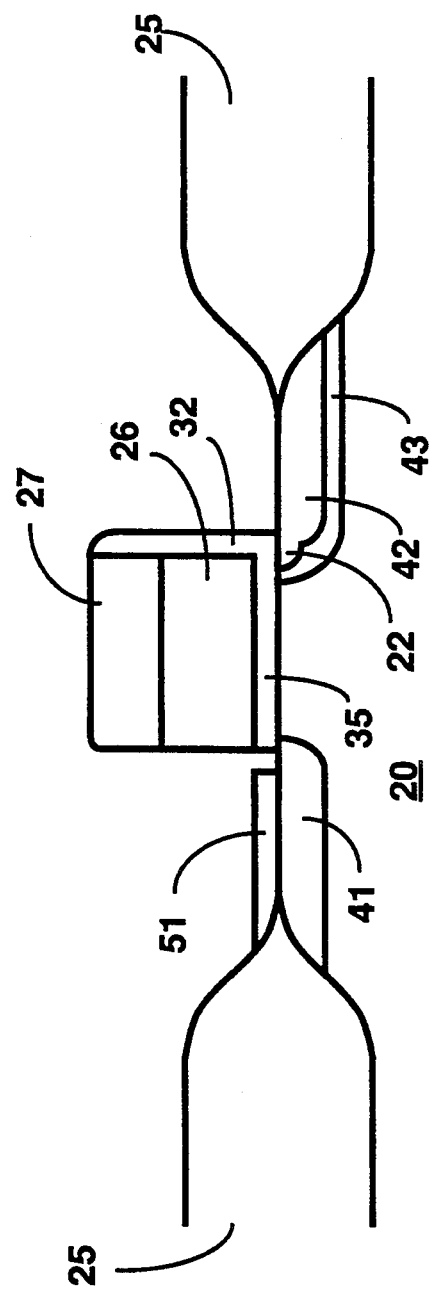

FIG. 2 through FIG. 4 illustrate processing steps used for producing an asymmetric electro-static discharge transistor in accordance with preferred embodiments of the present invention.

The structure shown in FIG. 2 is formed in a well 20 of first conductivity type within a substrate. For example, the substrate may be of p-type material doped with $10^{15}$ atoms per cubic centimeter substrate may be of n-type material. A typical depth of the substrate is 500 microns. Well 20 may be, for example, of p-type material doped with $10^{16}$ atoms per cubic centimeter. Alternately, well 20 may be of n-type material doped with $10^{16}$ atoms per cubic centimeter.

A local oxidation of silicon (LOCOS) process or other process is used to form an insulating layer 25 of, for example, field oxide on the substrate as shown. For example, in a LOCOS process, a layer of pad oxide is deposited. On top of the pad oxide, a layer of nitride is deposited. The nitride is patterned and etched. Field oxide is grown on the substrate at places where the nitride has been etched to expose the substrate. The nitride and pad oxide are then removed.

After insulating layer 25 is formed, a layer of gate oxide 35 is placed (i.e. grown or deposited) on exposed portions of the substrate. A first gate region 26 is formed on gate oxide layer 35 using a mask and etch process. First gate region 26 may be made of polysilicon, for example, doped with n-type atoms at $10^{20}$ atoms per cubic centimeter.

Gate region 26 may be formed, for example, by chemical vapor deposition (CVD) of a polysilicon layer. The polysilicon is doped using POCl$_3$. Alternately, an implant of Phosphorus or Arsenic atoms may be used. If a polycide gate is desired, a metal layer is deposited on top of the polysilicon layer. A rapid thermal anneal (or other annealing process) is used to react the metal layer with the polysilicon layer. The metal-silicide layer may be formed, for example, using Titanium (Ti), Molybdenum (Mo), Chromium (Cr), Nickel (Ni), Platinum (Pt), Cobalt (Co), Tungsten (W) or Tantalum (Ta).

On top of the polysilicon (or polycide) layer there may be deposited a dielectric layer. The deposition of the dielectric layer is done, for example, using chemical vapor deposition (CVD) oxide. Alternately, deposition of the dielectric layer may be omitted. Using a mask, an etch is performed on both sides of a metal-silicide region 27 on top of first gate region 26. The etch exposes the gate oxide layer on top of the substrate.

On the sides of first gate region 26 and metal-silicide region 27 are implanted a region 21 and a region 22 of second conductivity type. Region 21 and region 22 act as source/drain regions for a transistor. For example, region 21 and region 22 are n$^-$ regions doped with Phosphorus at $10^{18}$ atoms per cubic centimeter. For example, region 21 and region 22 extend 0.15 micrometers below the surface of the substrate. Alternately, region 21 and region 22 may be p$^-$ regions. The resultant structure is shown in FIG. 2.

A deposition and etch back are used to form a sidewall region 31 and a sidewall region 32, which are on opposite sides of polysilicon region 26. Sidewall region 31 and sidewall region 32 serve as a spacers around polysilicon region 26. Sidewall region 31 and sidewall region 32 may be formed, for example by oxide deposition and etch back. Alternately, sidewall region 31 and sidewall region 32 may be formed by nitride deposition and etch back. For example, sidewall region 31 and sidewall region 32 are CVD oxide and each extends approximately 0.3 microns outward from polysilicon region 26. A dilute Hydrogen-Fluorine (HF) dip may be used to clear residual oxide over source/drain region 21 and source/drain region 22. The resulting structure is shown in FIG. 3.

For n-channel pull-down ESD transistors used in circuits utilizing CMOS technology, an ESD implant region 43 is formed by implanting Phosphorus atoms at, for example 4 times $10^{15}$ atoms per square centimeter. ESD implant region 43 extends, for example, approximately 0.2 micrometers below the surface of the substrate. In the preferred embodiment of the present invention, ESD implant regions are formed on a circuit only at the drain junction of the ESD n-channel pull-down transistors. This is achieved by designing an ESD implant mask such that the source side of the ESD pull down transistors are covered by photo resist. This can be done because the length of transistor gate 26 is normally larger than twice the alignment tolerance. The ESD implant mask also covers the source-drain regions of the other transistors, leaving exposed only the drain region of ESD transistors.

In the preferred embodiment an ESD implant (region 43) is employed. For process flows that do not employ an ESD implant, a regular-type n+ source/drain implant can be performed instead only to the drain junction of the n+ ESD transistors, in such a case, for example, an implant of n+-type atoms at $10^{20}$ atoms per cubic centimeter is made to a depth of, for example, approximately 0.25 micrometers.

After the implant of ESD region 43, a selective silicidation scheme is employed to form metal-silicide source/drain junctions throughout the circuit except the drain junction of the n-channel pull-down ESD transistors. This is done, for example, by utilizing the enhanced oxidation rate for a heavily-doped region to prevent silicidation over the drain region of the ESD transistors.

The differential oxidation is performed to grow a very thin (e.g., less than 5 nanometers thick) oxide on top of the lightly doped source-drain regions throughout the circuit. The lightly doped source-drain regions throughout the circuit include the source and drain junctions of all non-ESD transistors throughout the circuit, as well as the source and drain junctions of the p-channel pull-up ESD transistors and the source junction of the ESD pull-down n-channel transistors. During the differential oxidation, a much thicker oxide (e.g., between 10 and 15 nanometers) will be grown on the drain region of the ESD pull-down n-channel transistors. The differential oxidation is performed preferably at low-temp (e.g., 800° C.) and wet ambient to take full advantage of the enhanced oxidation rate of the heavily doped regions.

A thin layer of metal is deposited over the substrate. In the preferred embodiment, the metal is Titanium (Ti). Alternately, the metal layer may consist of another metal such as, for example, Molybdenum (Mo), Chromium (Cr), Nickel (Ni), Platinum (Pt), Cobalt (Co), or Tantalum (Ta). While in the following discussion of the present invention, reference is made to Titanium layers, for any reference to Titanium, these other metals may be substituted for Titanium. The layer of metal is, for example, 0.05 microns thick. After deposition of the metal layer, a rapid thermal anneal is used to form Titanium-silicide (TiSix) over all source/drain regions except the drain region of the n-channel ESD transistors. The rapid thermal anneal is done, for example, by heating the substrate to approximately 600 to 700 degrees Celsius for a period of approximately 15 seconds. The unreacted Titanium on top of the source-drain of the ESD transistors and elsewhere is stripped off, for example using a rinse of a mixture of $NH_4OH$, $H_2O_2$ and $H_2O$. Afterwards, a high-temp anneal (e.g., 800° C.) is applied to fully formed the highly conductive metal-silicide on the source-drain of the regular transistors.

For ESD pull-down n-channel transistors, the result is that a metal-silicide region 51 is formed over the source junction; however, no metal-silicide region is formed over drain junction.

After forming metal-silicide region 51, disposable sidewall spacer 31 on the source side of the n-channel ESD transistor is removed. In addition to the disposable sidewall spacers on the source side of all the n-channel ESD transistors, sidewall spacers may (optionally) be removed from all the transistors on the source side only.

After the selected disposable sidewall spacers are removed, the regular n+ and p+ source-drain implant can be performed on the circuit. For example, an ion implant is used to dope n+ source region 41 and n+ drain region 42 with n+-type atoms at $10^{20}$ atoms per cubic centimeter. Because sidewall spacer 31 was removed, n+ source region 41 completely overtakes n− region 21. Because sidewall spacer 32 remains, n+ drain region 42 only partially overtakes n− region 22. The n+ implant penetrates the metal-silicide region on the source. The result is seen in FIG. 4.

While, the above example represents a preferred embodiment of the present invention, the present invention may be embodied using other processing steps. For example, in the above embodiment, a polycide gate is assumed, so there is no need to form metal-silicide on top of the polycide gate. A top oxide stack could be used in the polycide gate stack to isolate the polycide from contacting with the Ti in this example, if needed. Otherwise, the thermal oxide grown on top of the polycide can also serve the isolation purpose.

Figure 5:
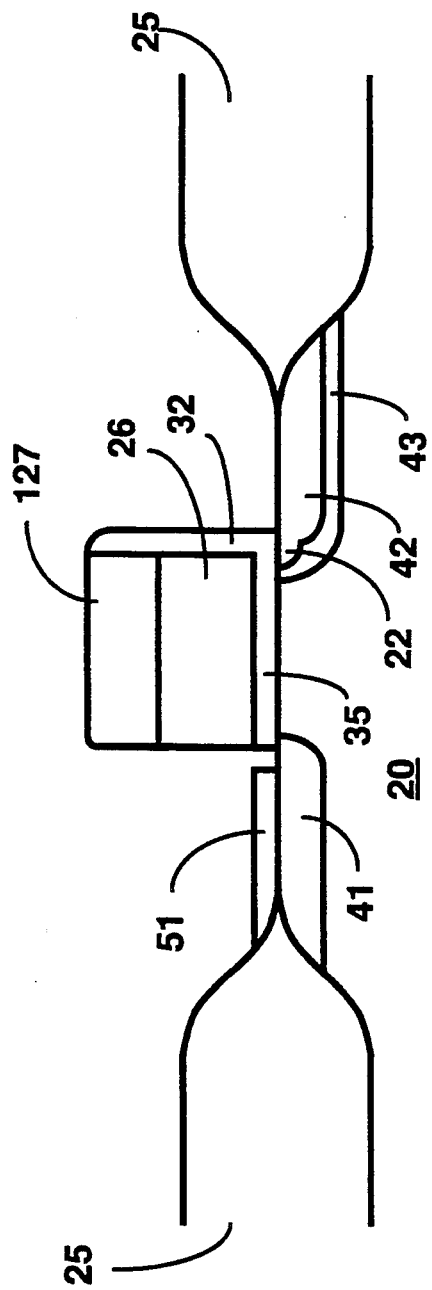
FIG. 5 illustrates an asymmetric electro-static discharge transistor in accordance with an alternate embodiment of the present invention.

For the case of a polysilicon gate, formation of metal-silicide on both the source-drain and the gate is desirable. To do this, a dielectric material which can be differentially etched from the sidewall dielectric (e.g., nitride if oxide is used for the sidewall dielectric; and oxide if nitride is used for the sidewall dielectric), can be added on top of the polysilicon gate as part of the gate stack. This top dielectric (assuming nitride is used) can be selectively stripped off by wet chemistry (e.g., phosphoric acid) immediately before the Ti deposition. In this way, metal-silicide can be formed on both the source-drain of the regular transistors, as well as on the poly gate of all transistors (including ESD transistors), and all polysilicon interconnects. For example, a nitride region 127 is placed on first gate region 26 instead of metal-silicide region 27) as illustrated by FIG. 5. The nitride region may be stripped using hot phosphoric acid selectively without stripping oxide or polysilicon.

Also, in the preferred embodiment described above, the LDD dose in region 21 was overtaken by the later n+ source/drain implant at the source junction of the ESD transistors. For a process where this would not be the case, the LDD implant mask can be designed so that the source junction of the ESD transistors do not receive the LDD implant. In such a case, n− region 21 would never be formed.

Also, in the preferred embodiment described above, the n+ and p+ source-drain implants were performed after metal-silicide formation. Alternately, the n+ and p+ source-drain implants could be performed before deposit of the Titanium.

Also, in an alternate embodiment of the present invention, the asymmetric ESD transistors can also be applied to a process flow where metal-silicide is not placed over the source. In this case, no metal-silicide will be formed on either source or drain regions of the transistors.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A buffer transistor constructed as part of an integrated circuit, the transistor comprising:
    a substrate;
    a gate region on the substrate, the gate region including a polysilicon gate region placed over a dielectric layer;
    a drain region within the substrate, the drain region including
        a first drain region implanted with atoms of a first conductivity type at a first concentration, the first drain region extending under the gate region, and
        a second drain region adjacent to the first drain region and larger in area than the first drain region, the second drain region being implanted with atoms of the first conductivity type at a second concentration, the second concentration being greater than the first concentration; and,
    a source region within the substrate, the source region extending under the gate region, wherein the source region and the drain region are asymmetric in that the entire source region is uniformly implanted with atoms of the first conductivity type at the second concentration.

2. A buffer transistor constructed as part of an integrated circuit, the transistor comprising:
    a substrate:
    a gate region on the substrate, the gate region including a polysilicon gate region placed over a dielectric layer;
    a drain region within the substrate, the drain region including
        a first drain region implanted with atoms of a first conductivity type at a first concentration, the first drain region extending under the gate region, and
        a second drain region adjacent to the drain region, the second drain region being implanted with atoms of the first conductivity type at a second concentration, the second concentration being greater than the first concentration;

a source region within the substrate, the source region extending under the gate region and the entire source region being implanted with atoms of the first conductivity type at the second concentration; and, a metal-silicide region over the source region, wherein there is no metal-silicide region over the drain region.

3. A buffer transistor as in claim 2 additionally comprising:

an electro-static discharge implant region in the substrate below the drain region, the electro-static discharge implant region being implanted with atoms of the first conductivity type at a third concentration, the third concentration being greater than the first concentration.

4. A buffer transistor as in claim 3 wherein the first conductivity type is n-type, the second drain region and the source region being n+ regions and the first drain region being an n− region.

5. A buffer transistor as in claim 1 additionally comprising:

an electro-static discharge implant region in the substrate below the drain region, the electro-static discharge implant region being implanted with atoms of the first conductivity type at a third concentration, the third concentration being greater than the first concentration.

6. A buffer transistor as in claim 5 wherein the first conductivity type is n-type, the second drain region and the source region being n+ regions and the first drain region being an n− region.

7. A buffer transistor as in claim 1 wherein the first conductivity type is n-type, the second drain region and the source region being n+ regions and the first drain region being an n− region.

8. An output buffer for a circuit which electrically couples an output voltage to a pad, the output buffer comprising:

a first buffer transistor, coupled between the circuit and the pad; and, a second buffer transistor coupled between the circuit and the pad, the second buffer transistor comprising:

a substrate, a gate region on the substrate, the gate region including a polysilicon region placed over a dielectric layer, a drain region within the substrate, the drain region including a first drain region implanted with atoms of a first conductivity type at a first concentration, the first drain region extending under the gate region, and a second drain region adjacent to the first drain region and larger in area than the first drain region, the second drain region being implanted with atoms of the first conductivity type at a second concentration, the second concentration being greater than the first concentration, and a source region within the substrate, the source region extending under the gate region, wherein the source region and the drain region are asymmetric in that the entire source region is uniformly implanted with atoms of the first conductivity type at the second concentration.

9. An output buffer as in claim 8 wherein the first buffer transistor is a p-channel transistor and the second buffer transistor is an n-channel transistor.

10. An output buffer as in claim 8 wherein the second buffer transistor additionally comprises:

a metal-silicide region over the source region, wherein there is no metal-silicide region the drain region.

11. An output buffer as in claim 10 wherein the second buffer transistor additionally comprises:

an electro-static discharge implant region in the substrate below the drain region, the electro-static discharge implant region being implanted with atoms of the first conductivity type at a third concentration, the third concentration being greater than the first concentration.

12. An output buffer as in claim 11 wherein the first conductivity type is n-type, the second drain region and the source region being n+ regions and the first drain region being an n− region.

13. An output buffer as in claim 8 wherein the second buffer transistor additionally comprises:

an electro-static discharge implant region in the substrate below the drain region, the electro-static discharge implant region being implanted with atoms of the first conductivity type at a third concentration, the third concentration being greater than the first concentration.

14. An output buffer as in claim 13 wherein the first conductivity type is n-type, the second drain region and the source region being n+ regions and the first drain region being an n− region.

15. An output buffer as in claim 8 wherein the first conductivity type is n-type, the second drain region and the source region being n+ regions and the first drain region being an n− region.

* * * * *